United States Patent
Lee et al.

(10) Patent No.: US 8,546,176 B2
(45) Date of Patent: Oct. 1, 2013

(54) FORMING CHALCOGENIDE SEMICONDUCTOR ABSORBERS

(75) Inventors: Wen-Chin Lee, Hsinchu (TW);
Wen-Tsai Yen, Caotun Township (TW);
Ding-Yuan Chen, Taichung (TW);
Liang-Sheng Yu, Kaohsiung (TW);
Yu-Han Chang, Hsin-Yuan Village (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 554 days.

(21) Appl. No.: 12/765,407

(22) Filed: Apr. 22, 2010

(65) Prior Publication Data

US 2011/0263072 A1 Oct. 27, 2011

(51) Int. Cl.
*H01L 21/00* (2006.01)

(52) U.S. Cl.
USPC ............................................. 438/95; 438/98

(58) Field of Classification Search
USPC ...................................... 438/93–98
See application file for complete search history.

(56) References Cited

U.S. PATENT DOCUMENTS

| | | | |
|---|---|---|---|
| 5,029,087 A | | 7/1991 | Cowan et al. |
| 5,626,688 A | * | 5/1997 | Probst et al. .................. 136/265 |
| 5,981,868 A | | 11/1999 | Kushiya et al. |
| 6,259,016 B1 | | 7/2001 | Negami et al. |
| 6,534,704 B2 | | 3/2003 | Hashimoto et al. |
| 8,048,477 B2 | * | 11/2011 | Van Duren et al. ............. 427/74 |
| 2007/0163640 A1 | | 7/2007 | Van Duren et al. |
| 2008/0305247 A1 | | 12/2008 | Von Klopmann et al. |
| 2010/0055826 A1 | | 3/2010 | Zhong et al. |
| 2012/0228731 A1 | * | 9/2012 | Bruce et al. ................... 257/431 |

FOREIGN PATENT DOCUMENTS

| | | |
|---|---|---|
| CN | 101443130 A | 5/2009 |
| KR | 20100058751 A | 6/2010 |
| WO | WO 9427328 | 11/1994 |

OTHER PUBLICATIONS

Notice of Decision for Patent issued Jun. 25, 2012, in counterpart Taiwan Patent Application No. 10-2010-0106410.
Kessler, J. et al., "Progress in Low-Cost Electrodeposition of Cu(ln,Ga)(S,Se)2: The Cisel Project", 20th European Photovoltaic Solar Energy Conference, Jun. 2005, Barcelona, Spain, pp. 1704-1708.
Official Action issued Jul. 4, 2012, in counterpart Chinese Patent Application.
Development of Thin Film CIGS Mini Module, Ministry of Commerce, Industry and Energy, Dec. 2007, 226 pages.
Official Action issued Dec. 14, 2011 in counterpart Korean patent application.
Ohashi, D. et al., "Improved CIGS Thin-Film Solar Cells by Surface Sulfurization Using In2S3 and Sulfur Vapor", Solar Energy Materials & Solar Cells 67 (2001), pp. 261-265.
Official Action issued May 28, 2013, in counterpart Taiwan Patent Application.
Paper entitled "CIGSS", 2009, 3 pages, retrieved from http://libproxy.ncue.edu.tw/cgi-bin/cdrfb3/gsweb.cgi?o=dstdcdr&i=sid=%22G0N123512087%22.
Hariskos, D. et al., "Buffer layers in Cu(ln,Ga)Se2 solar cells and modules", Thin Solid Films, 2005, 480-481:99-109.

* cited by examiner

*Primary Examiner* — Richard Booth

(57) ABSTRACT

Sulfur-containing chalcogenide absorbers in thin film solar cell are manufactured by sequential sputtering or co-sputtering targets, one of which contains a sulfur compound, onto a substrate and then annealing the substrate. The anneal is performed in a non-sulfur containing environment and avoids the use of hazardous hydrogen sulfide gas. A sulfurized chalcogenide is formed having a sulfur concentration gradient.

22 Claims, 5 Drawing Sheets

US 8,546,176 B2

FORMING CHALCOGENIDE SEMICONDUCTOR ABSORBERS

FIELD OF THE INVENTION

The present invention generally relates to solar cells. More particularly, it relates to new and improved methods for forming a sulfurized chalcogenide absorber layer.

BACKGROUND

Solar energy, or converting sunlight into electrical energy, can be competitive with other forms of energy generation if it is efficient, cheap, and safe. Thin film solar cell technology combines low manufacturing cost and relatively high efficiency, but still involves toxic and hazardous materials and processes.

Generally, solar cells work by absorbing photons, which excite electrons from a valence band to a conduction band. When connected to a circuit, the electrons in the conduction band flow to drive an electrical current. Thin film solar cells use absorber layers that exhibit direct bandgaps, allowing the cells to be only a few micrometers thick. In many thin film solar cells, the photon, or light, absorber includes elements from each of Group I (copper, silver, gold), Group III (aluminum, gallium, indium), and Group VI (sulfur, selenium, tellurium). In some cases, zinc and tin are used instead of Group III elements. In one such solar cell, the I-III-VI2 semiconductor material is Copper Indium Gallium (di)Selenide (CIGS). The material is a solid solution of copper indium selenide (often abbreviated "CIS") and copper gallium selenide, with a chemical formula of $CuIn_xGa(1-x)Se_2$, where the value of x can vary from 1 (pure copper indium selenide) to 0 (pure copper gallium selenide). It is a tetrahedrally-bonded semiconductor, with the chalcopyrite crystal structure, and a bandgap varying continuously with x from about 1.0 eV (for copper indium selenide) to about 1.7 eV (for copper gallium selenide).

Sulfur containing CIGS thin films, also known as CIGSS, has been shown to improve solar cell efficiencies. CIGSS semiconductor materials have direct bandgap wider than that of CIGS. The bandgap is between 1.0 and about 2.5 eV, which better correspond to the solar radiation range than CIGS thin films and allows optimum solar radiation absorption. High conversion efficiencies of up to 19.5% have been reported on small-area cells. In one instance, CIGSS surface is sulfurized by annealing in hydrogen sulfide gas ($H_2S$). Because hydrogen sulfide gas is highly toxic and therefore presents manufacturing issues, alternative sulfurization techniques involve vaporizing sulfur and sulfur compounds (e.g., indium sulfide ($In_2S_3$)) in the presence of a CIGS film. Vaporization can be carried out by heating mall amounts of sulfur or sulfur compounds in a cruicible furnace at very high temperatures next to a CIGS film. While safer, the vaporization processes that do not employ $H_2S$ are still not suitable for cost-effective mass manufacturing and improved methods are desired.

DETAILED DESCRIPTION

Figure 1:
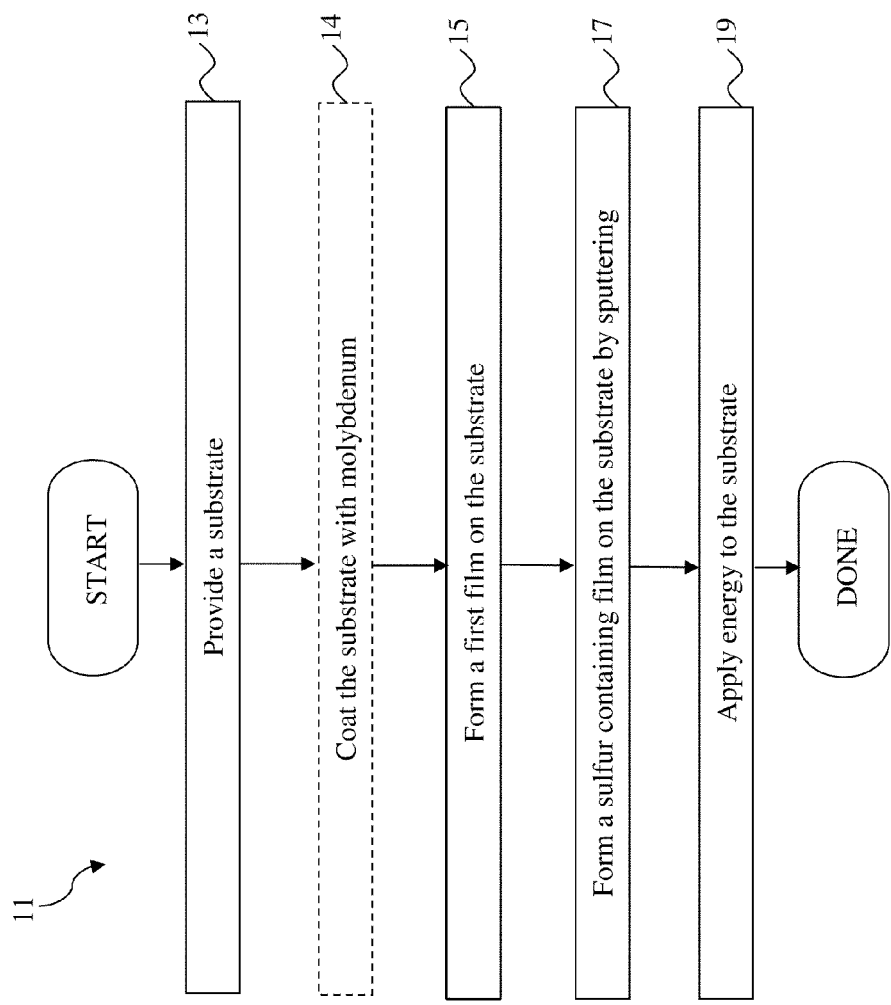
FIGS. 1-3 are process flow diagrams of various manufacturing techniques in accordance with various embodiments of the present invention.

This description of the exemplary embodiments is intended to be read in connection with the accompanying drawings, which are to be considered part of the entire written description. In the description, relative terms such as "lower," "upper," "horizontal," "vertical," "above," "below," "up," "down," "over," "under," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Further, these relative terms do not require a direct relationship between the elements under discussion and one or more intervening elements may be present. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In one aspect, the present disclosure pertains to methods for manufacturing a solar cell having sulfurized chalcogenide semiconductor absorbers. The surface sulfurization is achieved by sputtering a sulfur-containing target onto a bulk layer that is first sputtered onto a substrate. In some embodiments, the sputtering occurs sequentially—the bulk layer is formed first by sputtering before the sulfur is sputtered. In other embodiments, the sputtering occurs partially simultaneously—a portion of the bulk layer is formed first by sputtering and the sulfur sputtering starts along with sputtering of the remaining bulk layer. In either case, the substrate is then subjected to heat or other energy to promote diffusion of the surface sulfur. The absorber thus manufactured has a sulfur concentration gradient highest at the surface.

A particular feature of these method embodiments of the present invention is having processes that can be used in mass manufacturing. Known methods of sulfurization require heating a bulk chalcogenide film in a gas or vapor environment. One example includes heating the film in a hydrogen sulfide gas environment. Other examples involve evaporating small amounts of sulfur or sulfur compounds in a chamber and have the vapor condense onto the film before annealing. These processes involve very high temperatures and can be difficult to control. These processes are not easily scalable and are not safe for mass manufacturing. On the other hand, sputtering processes are used in semiconductor processing for forming various metal and dielectric layers. Using the sputter process disclosed herein to sulfurize the film surface avoids the use of sulfur-containing gas environments, which as disclosed above, may be toxic and harder to control than sputtering processes.

Figure 2:
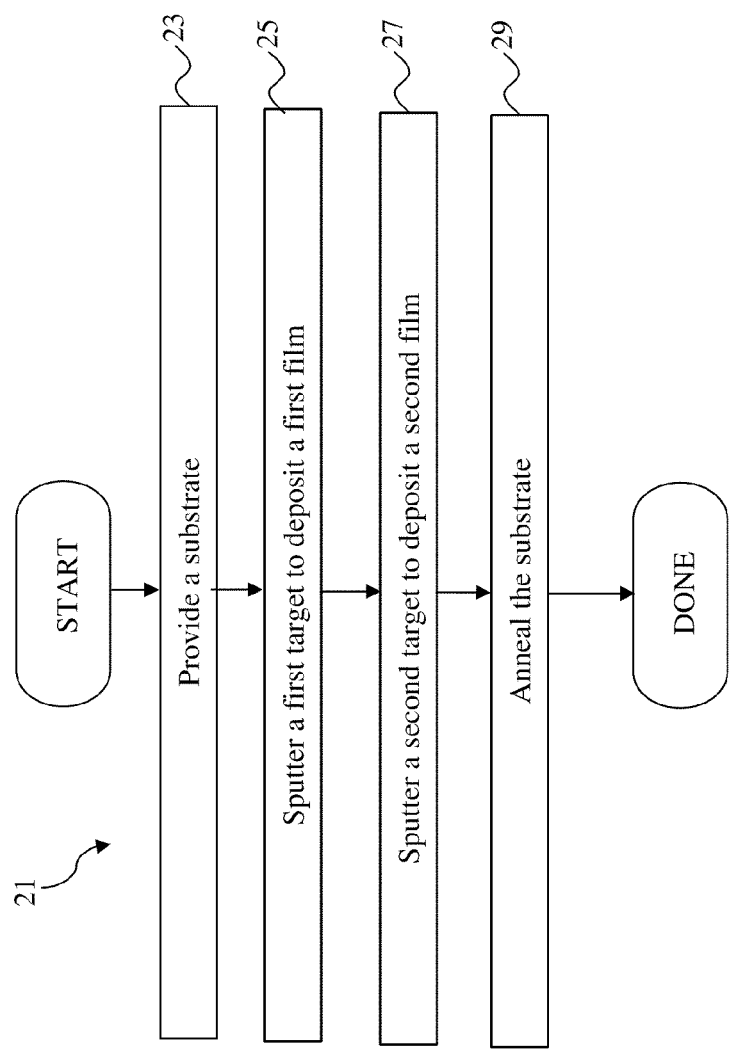
Figure 3:
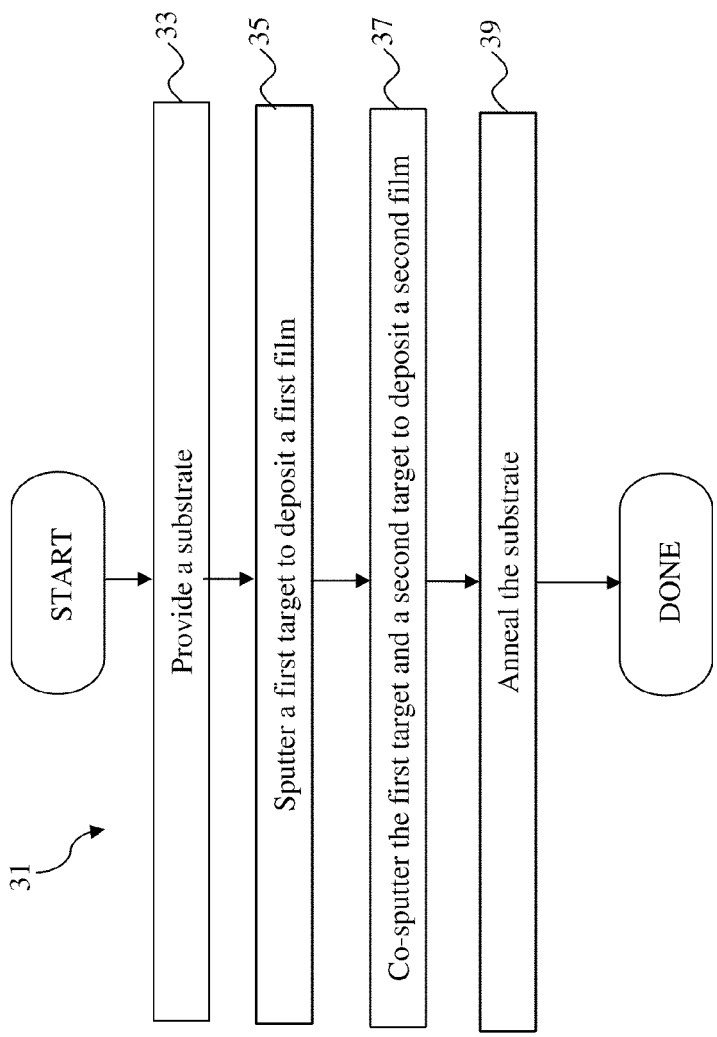

FIGS. 1 to 3 are process flow diagrams showing various method embodiments of the present invention. Referring to FIG. 1, the method 11 includes providing a substrate (13), optionally coating the substrate with molybdenum (14), forming a first film on the substrate by sputtering a first target (15), forming a second film on the substrate by sputtering a second target (17), and, applying energy to the substrate to promote diffusion (19). The substrate can be any substrate known for thin film solar cells. Particularly, glass or silicon substrates are used. Preferably, soda-lime glass substrates are used because films formed thereon have reported higher electrical conductivity and cells having increased open circuit voltages and fill factor. The substrate may be coated with a layer of molybdenum, or other commonly used back contact such as W, Mo, Cr, Ta, Nb, V, Ti, Mn. Various known methods are used to coat the back contact, including plasma assisted gas phase deposition or DC and RF magnetron sputtering using appropriate precursor materials.

After the substrate is coated in operation 14, a first film is formed on the substrate in operation 15 by sputtering a first target. The target includes at least two of the constituents of the chalcogenide thin film chosen from elements in groups I, III, and VI, as disclosed above. In a second sputtering operation 17, the remaining constituents of the chalcogenide thin film is sputtered onto the substrate along with sulfur, forming a second film. The second sputtering target may include constituents from the first target. In one embodiment, the two targets together deposits copper, indium, gallium, selenium, and sulfur to form a CIGSS composite film, with one layer deposited by the first sputtering and one layer deposited by the second sputtering. The sulfur is included only in the second target and thus is present only in the second film, or top layer of the composite film. The first sputtering deposits the bulk of the composite film. The second film has a thickness of about 5 to 50 percent of the first film. Preferably, the second film has a thickness of about 25 percent of the first film.

Any known sputtering techniques for the appropriate targets may be used. Generally, a plasma is generated in a reaction chamber in the vicinity of a target. The sputtering gas may be argon, nitrogen, or other known sputtering gas. Different sputtering gas may be used for the first film and the second film. Other process conditions including substrate temperature, working pressure, sputtering energy, the use of bias on the substrate, and relative positioning of the target and the substrate may also vary between depositing the first film and the second film.

During sputtering, the plasma species (ions and atoms) bombard the target and cause small fragments of the target to separate or evaporate from the bulk. These small fragments deposit onto the substrate. The plasma may be generated using a radio frequency (RF) generator, direct-current (DC) generator, microwave or ion-beam. The plasma may also be generated remotely. Various sputtering processes are known in semiconductor processing and details are not described herein. In addition to sputtering the first target, a reactive or precursor gas may be introduced in the process chamber to react or co-deposit on the substrate with the sputtered material.

Various targets may be used to deposit the first film. The first target can be binary, ternary, or quarternary. Binary options include targets having CuSe, CuTe, CuGa, CuIn, CuAl, AgSe, AgTe, AgGa, AgIn, AgAl, AuSe, AuTe, AuGa, AuIn, AuAl, InSe, GaSe, or AlSe. Preferably, the binary target is CuSe, CuGa, or CuIn. Note that the target listing merely expresses the elemental components and not specific ratio or compounds. For example, the CuSe target may be an alloy mixture or copper selenide having a formula of $Cu_2Se$ or a mixture of copper metal and $Cu_2Se$ or another copper selenide compound. In certain embodiments, the binary target includes an element from group I and an element from groups III or VI. In some embodiments, tin or zinc may replace a group III element.

Ternary options include targets having CuInSe, CuInTe, CuInGa, CuAlGa, CuZnSn, CuAlin, CuGaSe, CuGaTe, CuAlSe, CuAlTe, AgInSe, AgInTe, AgInGa, AgAlGa, AgZnSn, AgAlIn, AgGaSe, AgGaTe, CuGaSe, CuGaTe, AuInSe, AuInTe, AuInGa, AuAlGa, AuZnSn, AuAlin, AuGaSe, AuGaTe, AuAlSe, or AuAlTe. Preferably, the ternary target is CuInSe, CuInGa, CuZnSn, or CuGaSe. In some cases, the ternary target is a mixture of two binary target alloys. For example, the CuSe and CuGa targets may be mixed to form a CuGaSe ternary target. In certain embodiments, the ternary target includes an element from group I and two elements from groups III and VI. In some embodiments, tin or zinc may replace a group III element.

Quarternary options include targets having Cu(In,Ga)Se, Cu(Al,In)Se, Cu(Al,Ga)Se, Cu(In,Ga)Te, Cu(Al,In)Te, Cu(Al,Ga)Te, Ag(In,Ga)Se, Ag(Al,In)Se, Ag(Al,Ga)Se, Ag(In,Ga)Te, Ag(Al,In)Te, Ag(Al,Ga)Te, Au(In,Ga)Se, Au(Al,In)Se, Au(Al,Ga)Se, Au(In,Ga)Te, Au(Al,In)Te, or Au(Al,Ga)Te. Preferably, the quarternary target is Cu(In,Ga)Se, Cu(Al,In)Se, or Cu(Al,Ga)Se. The targets may be single phase material, alloy target or a mixture of different materials. As noted above for binary targets, these target listings express the elemental components and not specific ratios or compounds. For example, the target having copper, indium, gallium, and selenium may be more correctly expressed as $Cu(In,Ga)Se_2$, where the target is a mixture of $CuInSe_2$ alloy and $CuGaSe_2$ alloy. A quarternary target may also be a mixture of two or three binary target alloys or compounds. In certain embodiments, the quarternary target includes an element from group I, two elements from group III, and one element from group VI. In some embodiments, tin or zinc may replace a group III element.

After the first film is deposited with the first target, a second film is deposited. The substrate may be moved between depositing the first film and the second film during sequential deposition. In other words, the second film may be deposited in a different process chamber from the first one.

In some embodiments, the substrate is not moved and the same process chamber is used for the first film and the second film. In certain embodiments, the process chamber may have more than one target area. The first and second targets are placed in the vicinity of the substrate. When the first target is sputtered, the plasma is formed such that only, or substantially only, the first target is sputtered. This may be accomplished, for example, by using RF, Pulse DC or DC magnetron to generate and control the plasma and using the target itself as one of the electrodes. During the second film deposition, a second plasma may be struck using the second target as an electrode. In these embodiments, placement of the targets is important to assure uniformity of the film deposited. The substrate and/or the target areas may move relative to one another to ensure uniformity.

In other embodiments, only one target area is present in the chamber. In these embodiments a robot arm may switch out the target between depositing the first and second films. The target may also be flipped to present different material on an opposite face. Various options are available to deposit two films using different target material in the same chamber.

The second target includes sulfur, which may be present in its elemental form or as a compound. The target includes about 40 to 90 percent sulfur by atomic ratio, preferably about 70 percent sulfur by atomic ratio. The sulfur may be indium sulfide, copper sulfide, gallium sulfide, aluminum sulfide, tin sulfide, zinc sulfide, silver sulfide, or gold sulfide. The target may also include a metal from groups I or III. The specific constituents of the second target depend, in part, on the constituents of the first target. Particularly, the target may include indium, selenium, and sulfur as an alloy, solid mixture, or a compound. Generally, targets of various constituents, concentration, and purity are readily available from various vendors. One skilled in the art would be able to select two targets having constituents that, when deposited onto the same substrate, would form a desired chalcogenide film after applying energy in operation 19.

In one embodiment, a second target of indium sulfide is used. The indium sulfide may be in a solid mixture with indium. Overall, the indium concentration may be about 10-60 atomic percent, or about 30 atomic percent and the sulfur concentration may be about 40-90 atomic percent or about 70 atomic percent.

Energy is applied to the substrate in operation 19 to promote diffusion of the various constituents to form the sulfur-containing chalcogenide. The energy may be applied in the form of heat via conduction, convection, or radiation. In one embodiment, resistive heating is used by heating a pedestal on which the substrate sits. In other embodiments, radiation heating by using infrared light is used. Other forms of heating includes using other heating fluids, plasma, or other types radiation. The energy is applied preferably in an inert gas environment or in a vacuum environment. In some instances, ambient environments can be used. A sulfur-containing environment is not required because the sulfur is already deposited in the film by sputtering.

Energy is applied so that the substrate is heated to about 400 to about 600 degrees Celsius. In some embodiments, the substrate is heated to about 580 degrees Celsius. During this operation the various deposited constituents form a chalcogenide structure having a chalcopyrite phase. The sulfur diffuses into the film forming a concentration gradient into the film, with a maximum concentration at the surface of the film.

In certain embodiments, operations 15, 17, and 19 are performed in the same process chamber. According to these embodiments, performing the various operations in the same process chamber is advantageous for several reasons. The substrate is not exposed to environments between process steps where the thin film can be contaminated. The process may be faster from a throughput perspective because less time or no time is spent on substrate movement. Furthermore, process chamber utility is very high because chambers do not have much idle time waiting for some other chamber to finish its process.

In other embodiments, one or more of operations 15, 17, and 19 are performed in different process chambers. Using different process chambers increase flexibility in designing the process. For example, the use of plasma and targets in one chamber may preclude using infrared light heating in the same chamber. However, if the heating or annealing operation is performed in a separate chamber, all methods of supplying energy can be used.

FIG. 2 shows a process flow diagram specific to certain embodiments in accordance with the present invention. In process 21, a substrate is provided in operation 23. The substrate provided may be a molybdenum coated soda-lime glass substrate. In operation 25, a first target is sputtered to deposit a first film on the substrate. In operation 27, a second target containing sulfur is sputtered to deposit a second film on the first film. The selection of first and second target material is as described above. The substrate is then annealed in operation 29 at a sufficiently high temperature to form the chalcogenide film.

FIG. 3 shows yet another process flow in accordance with certain embodiments of the present invention. In process 31, a substrate is provided in operation 33 as in FIGS. 1 and 2. A first target is sputtered to deposit a first film on the substrate in operation 35. However, in the next operation 37 the first target and the second target are co-sputtered to deposit a second film. In operation 37, the first and second target may be sputtered at different rates so that the composition of the second film may be controlled. The co-sputtering may also vary over time so that the first target sputtering slowly decreases and that the second film is formed with a concentration gradient of the second target material into the film. These techniques would form a composite film having specific and varying concentrations to achieve desired film properties. After the first and second films are deposited, the substrate is annealed to form the chalcogenide film in operation 39.

Although the processes with respect to FIGS. 1-3 are described using two targets and two sputtering processes, the invention is not necessarily so limited. More than two targets and more tan two sputtering processes are contemplated to further control the composition of the composite film. The last sputtering operation preferably uses a target having sulfur so the concentration of sulfur is higher near the film surface. For example, a first sputtering process may use a copper and gallium target. A second sputtering process may include an indium selenium target that is co-sputtered with a copper selenium target. A third sputtering process may include an indium sulfide target. One skilled in the art would be able to devise sputtering processes that would form film layers having desirable compositions.

Figure 4:
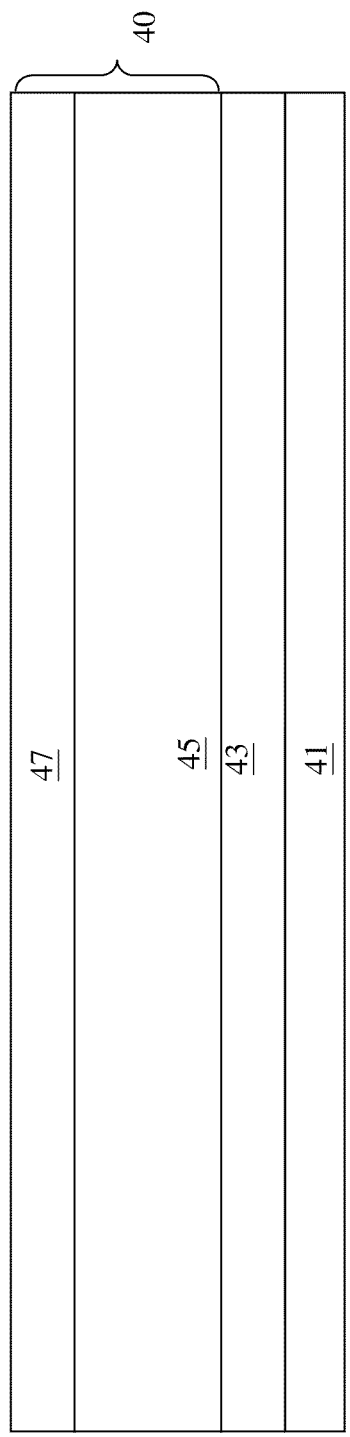
FIG. 4 represents a CIGSS film structure during a manufacturing process in accordance with various method embodiments of the present invention.

FIG. 4 shows a partially fabricated solar cell. Note that the relative thicknesses in the layers depicted are shown for convenience only and have no particularly relevance to the actual film layers. The substrate 41 is coated with a molybdenum layer 43 as described above. Film layers 45 and 47 are sputtered on the substrate above the molybdenum coating 43, forming a composite film 40. First film layer 45 includes at least two elements from groups I, III, and VI. Second film layer 47 includes sulfur, and the remaining constituents to form a pentanary chalcogenide. The second film layer 47 thickness is less than that of the first film layer 45. The second film thickness may be about 5-50 percent of the first film, or about 25 percent of the first film.

In one example, the first film includes copper at 25 atomic percent, indium at 17.5 atomic percent, gallium at 7.5 atomic percent, and selenium at 50 atomic percent. The second film includes indium at 40 atomic percent and sulfur at 60 atomic percent.

Figure 5:
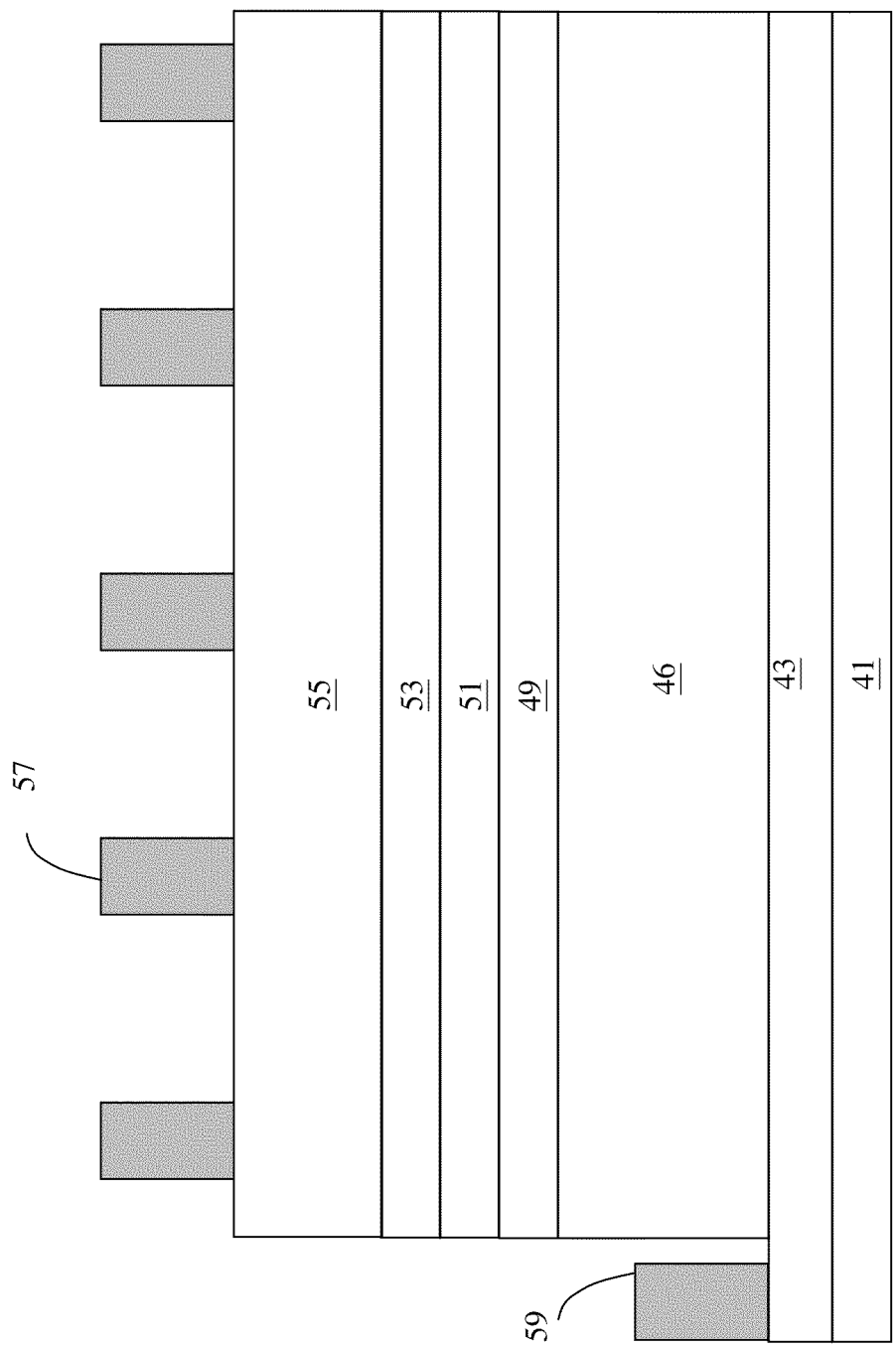
FIG. 5 is a diagram showing a CIGSS solar cell in accordance with various embodiments of the present invention.

FIG. 5 shows a cross section of a solar cell formed in accordance with various embodiments of the present invention. The chalcogenide film 46 is formed from the composite film 40 of FIG. 4. The film 46 includes sulfur at its top surface where it interfaces with film 49. The film 46 is a p-type semiconductor and serves as a light-absorption layer.

Film 49, formed on top of film 46, may include cadmium and sulfur. Various known processes can be used to deposit film 49, including a vapor deposition process or chemical bath deposition. Layer 51 is formed on film 49 and may include zinc and oxygen or sulfur. Layer 51 may be intrinsic zinc oxide. Alternatively, an element from group IIIa (e.g., In) or a chalcogenide containing Zn and an element from group IIIa can be used. The next layer 53 is an n-type semiconductor disposed over the p-type semiconductor 46 on the light incident side, with one or more intervening layers in-between. Layers 53 and 46 form the p-n junction of the solar cell. The layer 53 may be made of the same material as layer 51, except for the n-type doping. Thus, one layer of material may be deposited to form layers 51 and 53. The layer would then be doped with n-type dopant to form layer 53. A commonly used material for layers 51 and 53 is zinc oxide, using group IIIa (e.g., B, Al, Ga, In) as the n-type dopant or include indium tin oxide.

Film 55 is an optional ohmic contact layer, or an anti-reflective layer, or a self-cleaning layer. Typical material used may include, tin oxide, or indium oxide. After the various layers are formed, a trench is formed into the film stack to the molybdenum coating 43 or a portion of the chalcogenide layer 46 so a circuit having electrodes 59 and 57 can be formed. Generally, the trench is formed by etching or other techniques for removing a portion of the film stack. Using semiconductor etch techniques, the substrate is first patterned to protect the areas not to be etched and then the trenches formed using dry etch or wet etch techniques.

After the trenches are formed, the film edges of layers 46, 49, 51, 53, and 55 may be protected before the electrodes are formed. Electrodes may be formed using various techniques including plating, physical or chemical vapor deposition, or printing. Typically, the electrodes are connected to wires or interconnects for current collection during solar cell operation.

Particular features of this disclosure include a simple manufacturing technique to form a chalcogenide absorber. The process operations are simplified and uses only one annealing operation, as opposed to two annealing operations in other processes. Further, the disclosed process avoids the use of selenium containing or sulfur containing gas environments, which are difficult to use in a mass-production environment. Particularly, hydrogen selenide and hydrogen sulfide, both of which are very toxic at low concentrations, are avoided.

Although the present invention embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a solar cell, said method comprising:
    providing a substrate; forming a first film on the substrate by sputtering a first target;
    forming a second film on the substrate, said forming the second film comprising sputtering a second target over the first film, wherein said second target comprising sulfur or a compound of sulfur; and, forming a chalcogenide solar absorber from the first and the second film by applying energy to the substrate, said chalcogenide solar absorber comprising at least one element from group I and two elements from group VI.

2. The method of claim 1, where the chalcogenide solar absorber further comprises two elements from group III.

3. The method of claim 1, wherein forming a second film further comprising sputtering the first target while sputtering the second target.

4. The method of claim 1, wherein the substrate is a soda-lime glass substrate.

5. The method of claim 4, further comprising coating the substrate with molybdenum.

6. The method of claim 1, wherein the second target comprises about 40 to 90 atomic percent sulfur.

7. The method of claim 1, wherein the second target comprises about 70 atomic percent sulfur.

8. The method of claim 1, wherein the second film has a thickness of about 5 to 50 percent of a thickness of the first film.

9. The method of claim 1, wherein the second film has a thickness of about 25 percent of a thickness of the first film.

10. The method of claim 1, wherein the second target includes indium, selenium, and sulfur.

11. The method of claim 1, wherein the applying energy is performed in a non-sulfur containing environment.

12. The method of claim 1, wherein the applying energy forms a chalcogenide solar absorber having a sulfur concentration gradient.

13. The method of claim 1, wherein the applying energy comprises exposing the substrate to radiation or plasma or heating the substrate using a heater and forms a chalcogenide solar absorber having a sulfur concentration gradient.

14. The method of claim 1, wherein the first target comprises two or more constituents selected from elements of the chalcogenide solar absorber; and wherein the second target comprises remaining elements of the chalcogenide solar absorber.

15. The method of claim 1, wherein the first target comprises: a first constituent selected from a group consisting of copper, silver, and gold; and a second constituent selected from a group consisting of aluminum, gallium, indium, zinc, tin, selenium, tellurium, and compounds comprising one or more of these.

16. The method of claim 1, wherein the first target comprises: a first constituent selected from a group consisting of copper, silver, and gold; a second constituent selected from a group consisting of aluminum, gallium, indium, zinc, tin, and combinations of these; a third constituent selected from a group consisting of selenium, tellurium, and compounds comprising one or more of these.

17. The method of claim 1, wherein the operations of forming a first film, forming a second film, and applying energy are all performed in one chamber.

18. A method of manufacturing a solar cell, said method comprising: providing a molybdenum coated glass substrate; forming a first film on the substrate by sputtering a first target; forming a second film on the substrate on the first film, said forming the second film comprising sputtering a second target over the first film, wherein said second target comprising sulfur or indium sulfide; and, annealing the substrate wherein the forming and annealing operations do not include using sulfur or sulfur compound containing gas.

19. The method of claim 1, wherein the sputtering a second target over the first film comprises generating a plasma in a reaction chamber and using a sputtering gas comprising one of argon and nitrogen and wherein plasma species including ions and atoms bombard the second target.

20. The method of claim 18, wherein the sputtering a second target over the first film comprises generating a plasma in a reaction chamber and using a sputtering gas comprising one of argon and nitrogen and wherein plasma species including ions and atoms bombard the second target.

21. The method of claim 1, wherein the second target comprises indium sulfide, copper sulfide, gallium sulfide, aluminum sulfide, tin sulfide, zinc sulfide, silver sulfide, or gold sulfide.

22. The method of claim 1, wherein the first target is an alloy selected from a group consisting of CuSe, CuTe, CuGa, CuIn, CuAl, CuInSe, CuInTe, CuInGa, CuAlGa, CuZnSn, CuAlIn, CuGaSe, CuGaSe, CuGaTe, CuAlSe, CuAlTe, Cu(In,Ga)Se, Cu(Al,In)Se, Cu(Al,Ga)Se, Cu(In,Ga)Te, Cu(Al,In)Te, Cu(Al,Ga)Te, AgSe, AgTe, AgGa, AgIn, AgAl, AgInSe, AgInTe, AgInGa, AgAlGa, AgZnSn, AgAlIn, AgGaSe, AgGate, CuGaSe, CuGaTe, Ag(In,Ga)Se, Ag(Al,In)Se, Ag(Al,Ga)Se, Ag(In,Ga)Te, Ag(Al,In)Te, Ag(Al,Ga)Te, AuSe, AuTe, AuGa, AuIn, AuAl, AuInSe, AuInTe, AuInGa, AuAlGa, AuZnSn, AuAlin, AuGaSe, AuGaTe, AuAlSe, AuAlTe, Au(In,Ga)Se, Au(Al,In)Se, Au(AlGa)Se, Au(In,Ga)Te, Au(Al,In)Te, Au(Al,Ga)Te, InSe, GaSe, and AlSe.

\* \* \* \* \*